(12) United States Patent
Tsai et al.

(10) Patent No.: US 9,998,241 B2
(45) Date of Patent: Jun. 12, 2018

(54) ENVELOPE TRACKING (ET) CLOSED-LOOP ON-THE-FLY CALIBRATION

(71) Applicant: MEDIATEK INC., Hsinchu (TW)

(72) Inventors: Chiou-Wei Tsai, Yunlin County (TW); Chia-Sheng Peng, Taichung (TW); Sheng-Hong Yan, Tainan (TW)

(73) Assignee: MEDIATEK INC., HsinChu (TW)

( * ) Notice: Subject to any disclaimer, the term of this patent is extended or adjusted under 35 U.S.C. 154(b) by 30 days.

(21) Appl. No.: 14/625,949

(22) Filed: Feb. 19, 2015

(65) Prior Publication Data
US 2016/0249300 A1    Aug. 25, 2016

(51) Int. Cl.
*H04B 17/13* (2015.01)
*H03F 1/32* (2006.01)
*H03F 1/02* (2006.01)

(52) U.S. Cl.
CPC ............... *H04B 17/13* (2015.01); *H03F 1/02* (2013.01); *H03F 1/32* (2013.01)

(58) Field of Classification Search
CPC .............. H03F 1/02; H03F 1/32; H04B 17/13
See application file for complete search history.

(56) References Cited

U.S. PATENT DOCUMENTS

| | | | | |
|---|---|---|---|---|
| 6,157,253 A * | 12/2000 | Sigmon | .................. | H03F 1/0222 330/10 |
| 7,653,147 B2 * | 1/2010 | Palaskas | ............... | H03F 1/0205 375/295 |
| 7,706,467 B2 * | 4/2010 | Kenington | ............ | H03F 1/0222 375/296 |
| 7,884,681 B1 * | 2/2011 | Khlat | ....................... | H03C 1/06 332/149 |
| 8,093,945 B2 * | 1/2012 | Wimpenny | ........... | H03F 1/0227 330/129 |
| 8,611,402 B2 * | 12/2013 | Chiron | .................. | H03F 1/0222 375/219 |

(Continued)

FOREIGN PATENT DOCUMENTS

| CN | 103493368 A | 2/2011 |
|---|---|---|
| CN | 103973248 A | 1/2013 |

(Continued)

*Primary Examiner* — Devan Sandiford
(74) *Attorney, Agent, or Firm* — Imperium Patent Works; Helen Mao; Darien Wallace

(57) ABSTRACT

Apparatus and methods are provided to calibrate a closed-loop envelop tracking system for a power amplifier of a wireless transmitter using standardized modulation signals. In one novel aspect, a closed-loop adaptive method is used to track changes in PA nonlinearity due to environmental or circuitry changes during operating condition using standardized modulation signals. In one embodiment, the PA supply voltage compensation lookup table (LUT) and/or the phase compensation LUT is updated during normal operation to sustain good linearity and efficiency performance. In another novel aspect, the PA target response is adjusted in response to changes in PA-related system configuration, such as changes in PA bias settings, and/or indicators measured from the transmitter such as changes in impedance or temperature changes for the RF module or the PA module. The PA supply voltage compensation LUT and/or the phase LUT is updated accordingly upon adjustment of the PA target response.

27 Claims, 5 Drawing Sheets

(56) References Cited

U.S. PATENT DOCUMENTS

| | | | | |
|---|---|---|---|---|
| 8,824,981 B2 | 9/2014 | Langer et al. | | 455/114.3 |
| 8,854,129 B2* | 10/2014 | Wilson | | H03G 3/004 330/136 |
| 9,197,162 B2* | 11/2015 | Chiron | | H03F 1/02 |
| 9,197,256 B2* | 11/2015 | Khlat | | H03F 1/0227 |
| 9,203,353 B2* | 12/2015 | Chiron | | H03F 1/26 |
| 9,413,299 B2* | 8/2016 | Camuffo | | H03F 1/02 |
| 2002/0041209 A1* | 4/2002 | Miyatani | | H03F 1/3247 330/149 |
| 2002/0094795 A1* | 7/2002 | Mitzlaff | | H03F 1/0211 455/245.1 |
| 2003/0058959 A1* | 3/2003 | Rafie | | H03F 1/3247 375/296 |
| 2003/0184374 A1* | 10/2003 | Huang | | H03F 1/3247 330/149 |
| 2004/0061555 A1* | 4/2004 | Lynch | | H03F 1/0222 330/136 |
| 2005/0141639 A1* | 6/2005 | Anvari | | H03F 1/02 375/296 |
| 2007/0178856 A1* | 8/2007 | Mitzlaff | | H03F 1/0227 455/127.1 |
| 2007/0259631 A1* | 11/2007 | Ljung | | H03F 1/0205 455/127.2 |
| 2008/0265996 A1* | 10/2008 | Kim | | H03F 1/3247 330/291 |
| 2009/0004981 A1* | 1/2009 | Eliezer | | H03F 1/0211 455/127.1 |
| 2009/0088093 A1* | 4/2009 | Nentwig | | H03F 1/3241 455/114.3 |
| 2009/0122911 A1* | 5/2009 | Carey | | H04L 27/368 375/296 |
| 2009/0256630 A1* | 10/2009 | Brobston | | H03F 1/3247 330/2 |
| 2012/0106676 A1* | 5/2012 | McCallister | | H03F 1/0266 375/297 |
| 2012/0108189 A1* | 5/2012 | McCallister | | H03G 3/3042 455/127.2 |
| 2012/0200354 A1 | 8/2012 | Ripley et al. | | 330/131 |
| 2012/0269240 A1* | 10/2012 | Balteanu | | H03F 1/0227 375/219 |
| 2013/0072139 A1* | 3/2013 | Kang | | H04B 1/0475 455/114.3 |
| 2013/0095777 A1* | 4/2013 | Muhammad | | H04W 52/52 455/127.2 |
| 2013/0229228 A1* | 9/2013 | Drogi | | H03G 3/004 330/127 |
| 2014/0057684 A1 | 2/2014 | Khlat | | 455/574 |
| 2014/0065986 A1* | 3/2014 | McCallister | | H03F 1/3247 455/91 |
| 2014/0073273 A1 | 3/2014 | Asensio et al. | | 455/114.3 |
| 2014/0167841 A1* | 6/2014 | Henshaw | | H03F 1/0227 330/124 R |
| 2014/0167843 A1* | 6/2014 | Asensio | | H03F 1/02 330/127 |
| 2014/0169427 A1* | 6/2014 | Asensio | | H03F 1/02 375/224 |
| 2014/0179250 A1* | 6/2014 | Shute | | H03F 1/0244 455/127.2 |
| 2014/0187182 A1* | 7/2014 | Yan | | H03G 3/004 455/115.1 |
| 2014/0194080 A1* | 7/2014 | Li | | H03F 1/025 455/226.1 |
| 2014/0213196 A1 | 7/2014 | Langer et al. | | 455/73 |
| 2014/0248844 A1* | 9/2014 | Langer | | H04B 1/0458 455/127.2 |
| 2014/0266423 A1* | 9/2014 | Drogi | | H03F 3/189 330/75 |
| 2015/0061761 A1* | 3/2015 | Wills | | H03F 1/0222 330/127 |
| 2015/0126141 A1* | 5/2015 | Arno | | H04B 1/0475 455/114.3 |
| 2015/0236729 A1* | 8/2015 | Peng | | H04B 1/0475 455/114.3 |
| 2015/0236877 A1* | 8/2015 | Peng | | H04L 25/08 375/297 |
| 2015/0280652 A1* | 10/2015 | Cohen | | H03F 1/0222 330/297 |
| 2015/0372647 A1* | 12/2015 | Camuffo | | H03F 1/02 375/300 |

FOREIGN PATENT DOCUMENTS

| | | |
|---|---|---|
| WO | WO2014151777 A1 | 3/2013 |
| WO | WO2014178487 A1 | 5/2013 |

* cited by examiner

ENVELOPE TRACKING (ET) CLOSED-LOOP ON-THE-FLY CALIBRATION

TECHNICAL FIELD

The disclosed embodiments relate generally to envelope tracking for wireless devices, and, more particularly, to envelope tracking closed-loop on-the-fly calibration.

BACKGROUND

The wireless communications industry has grown exponentially in recent years. In any wireless communications system, the radio frequency (RF) transmitter plays an important role. The power amplifier (PA) for an RF transmitter is the last stage of amplification in the transmitter chain. The performance of the PA for a wireless transmitter is critical and challenging in the transmission path for a wireless system. Since the PA is designed to drive large power into a load, such as an antenna, by a supply circuit, it is power-hungry and dominates the power dissipation of the transceiver unit. Further, since the PA is a critical element of the transmission path, it is expected to provide the desired output power with designed gains, high efficiency and linearity. New technologies have been developed to improve the efficiency of the PA. One of the key techniques is to use envelope tracking (ET) to provide supply voltage for the PA. An envelope tracking system constantly adjusts the supply voltage to the PA according to the input signal such that the power amplifier is operating more efficiently. Moreover, predistortion is often employed to mitigate AM/PM effect and further improve PA's linearity performance. For example, the digital predistortion, including an AM/AM predistortion and/or an AM/PM distortion, is used to improve system linearity. The problem occurs when the PA characteristics changes over time. PA characteristics are known to vary with circuitry or environmental factors such as load mismatch, temperature shift, voltage standing wave ratio (VSWR) changes, device aging and so on. Changes in PA characteristics result in loss of linearity and efficiency. One way to combat the problem is using open-loop calibration. However, open-loop calibration requires prior information about PA characteristics, which requires long factory calibration time due to the complexity of characterizing all combinations of different factors described above. Closed-loop adaptive calibration is preferred to track changes in PA characteristics. The challenges for closed-loop calibration are how to track the changes of PA characteristics adaptively and efficiently. Further, with the PA-related changes in the system, such as circuitry changes or environmental factors, setting a new PA target response is required or preferred to improve the overall system performance.

SUMMARY

Apparatus and methods are provided to calibrate a closed-loop envelop tracking system for a power amplifier of a wireless transmitter using standardized modulation signals. In one novel aspect, a closed-loop adaptive method is used to track changes in PA nonlinearity due to environmental or circuitry changes during operating conditions using standardized modulation signals. In one embodiment, the PA supply voltage compensation lookup table (LUT) is updated during normal operation to sustain good linearity and efficiency performance. In another embodiment, an AM/PM phase LUT is updated during normal operation. In yet another embodiment, an AM/AM LUT for a digital predistortion process is updated during normal operation. The wireless transmitter transmits a wireless signal utilizing ET adapting a PA supply voltage with a PA target response. The wireless transmitter obtains a reference signal, which is a baseband digital signal of the transmitted wireless signal using a standardized modulation signal specified by the wireless system and a detection signal, which is partial feedback from down-sampled PA outputs. The wireless transmitter computes a difference between a measured response and the PA target response based on the reference signal and the detection signal and adjusts a PA supply voltage compensation LUT based on the computed difference to maintain the linearity of the ET.

In another embodiment, an AM/PM compensation LUT is also updated when digital pre-distortion (DPD) is employed. The wireless transmitter computes a difference between a measured phase response and a predefined target phase response based on the reference signal and the detection signal. The wireless transmitter adjusts an AM/PM phase compensation LUT for the DPD module based on the computed phase difference to maintain the linearity of the envelope tracking system.

In another novel aspect, the PA target response is adjusted in response to changes in PA-related system configuration and/or indicators measured from the transmitter. The PA supply voltage compensation LUT and/or the phase LUT and/or the AM/AM predistortion LUT is updated accordingly upon adjustment of the PA target response. In one embodiment, the wireless transmitter adjusts the PA target response based on one or more changes of PA-related system configuration, for example, the PA gate bias setting. In another embodiment, the wireless transmitter detects changes in PA impedance. The wireless transmitter adjusts the PA target response based on the changes in PA impedance. In another embodiment, the wireless transmitter detects one or more temperature changes, such as temperature changes in the RF module or in the PA. The wireless transmitter adjusts the PA target response based on the detected temperature changes.

Other embodiments and advantages are described in the detailed description below. This summary does not purport to define the invention. The invention is defined by the claims.

BRIEF DESCRIPTION OF THE DRAWINGS

The accompanying drawings, where like numerals indicate like components, illustrate embodiments of the invention.

DETAILED DESCRIPTION

Reference will now be made in detail to some embodiments of the invention, examples of which are illustrated in the accompanying drawings.

Figure 1:
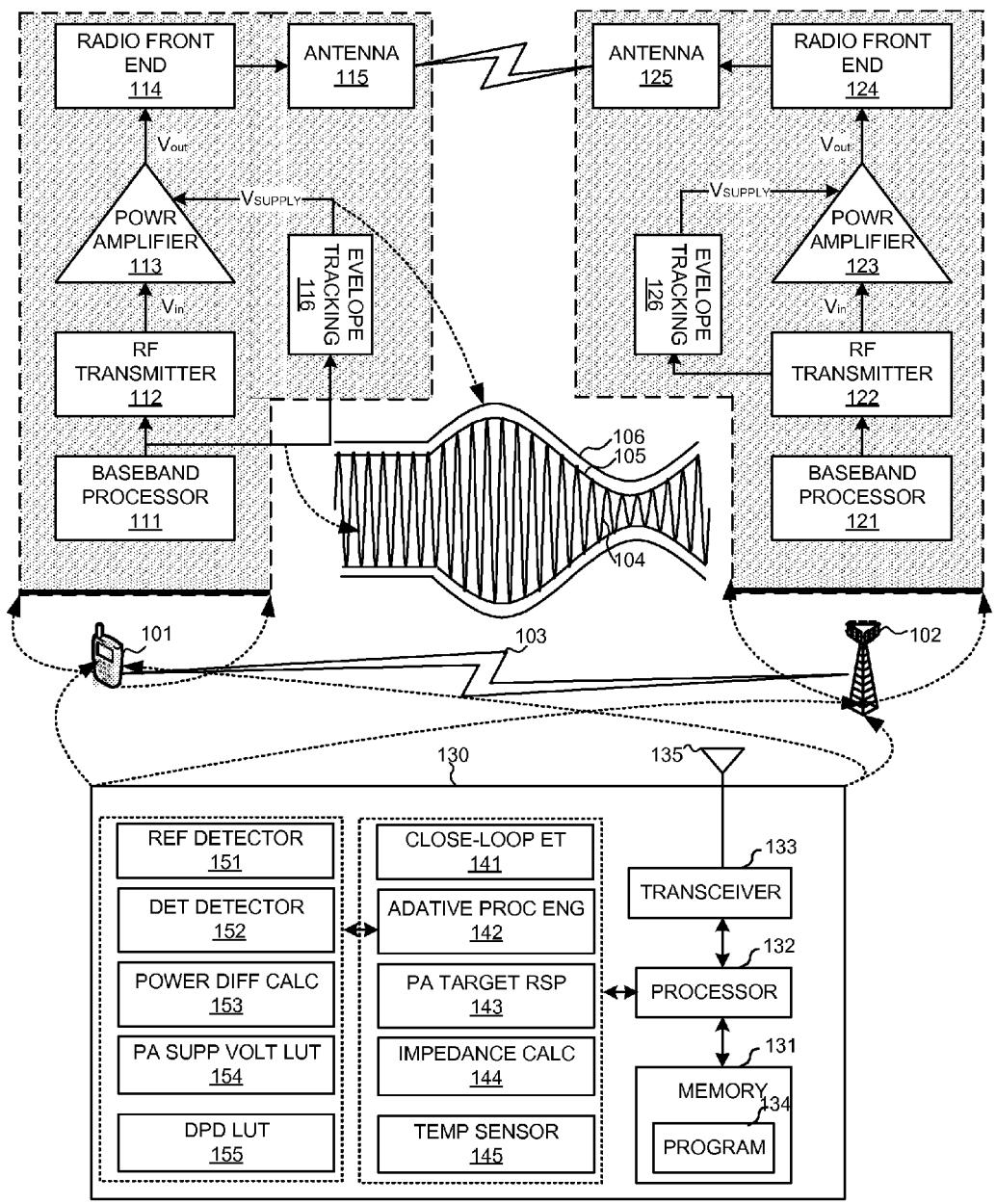
FIG. 1 illustrates an exemplary wireless communication system using closed-loop adaptive calibration for an envelope tracking system of a wireless transmitter.

FIG. 1 illustrates an exemplary wireless communication system using closed-loop adaptive calibration for an envelope tracking system of a wireless transmitter. A wireless user equipment (UE) 101 connects with a wireless base station 102 in a wireless system with modulation signals 103 specified by a wireless standard, such as 802.11, WLAN, WCMDA, LTE, LTE-A and other wireless standards. Wireless UE 101 and base station 102 both have radio frequency (RF) modules that transmit and receive wireless signals. UE 101 includes a baseband processor 111, an RF transmitter 112, a power amplifier 113, a radio front end 114, and an antenna 115. Similarly, base station 102 includes a baseband processor 121, an RF transmitter 122, a power amplifier 123, a radio front end 124, and an antenna 125. Baseband processors 111 and 121 process digital representations of selected channels and extract the raw data through demodulation and other signal processing. RF transmitters 112 and 122 up-convert the baseband data from the processor to RF frequency, typically through I/Q modulator. Power amplifiers 113 and 123 provide gain to the generated RF signal. Radio front-end modules 114 and 124 take the amplified RF signal and send it to the antenna. Antennae 115 and 125 transmit the amplified RF signals.

A power amplifier, such as PA 113 or PA 123, takes input power with a voltage of $V_{in}$, and applies a supply power $V_{supply}$ (or $V_{pa}$) to the PA such that the output signal voltage $V_{out}$ is amplified. Traditionally, the supply power is a constant DC voltage. The constant supply power results in large power waste. Many modern day wireless communication systems, such as 3G and 4G mobile networks, have a high peak to average power ratio (PAPR), suggesting that the dynamic range of signals to be amplified is very wide. Orthogonal frequency-division multiplexing (OFDM) modulation used in LTE is particularly susceptible to high crest factors, producing multiple peaks and valleys of power. As a result, the amplifier spends a lot of time amplifying small signals where the power efficiency is low. Further, due to high data rates required by demanding wireless applications, linear amplifiers must be used to preserve the modulation content. Envelope tracking (ET) solves the energy efficiency problem.

As shown in FIG. 1, both UE 101 and base station 102 can use envelope tracking. Envelope tracking system 116 of UE 101 takes input signal 104 from baseband processor 111, the baseband envelope signal 105 is sent to an ET power supply modulator that varies the supply voltage following baseband envelope signal 105. As a result, a supply voltage signal 106 varies based on the input signal. While input signal 104 at its peak signal levels, the supply voltage from ET 116 is high. While input signal 104 decreases, the supply voltage from ET 116 decreases to low signal levels. The result is that PA 113 operates near its optimum point for best efficiency by minimizing the dissipated heat energy. Similarly, base station 102 uses an envelope tracking system 126. ET 126 of base station 102 takes the input signal from RF transmitter 122, the baseband envelope signal is sent to an ET power supply modulator that varies the supply voltage following the baseband envelope signal. ET 126 supplies PA 123 with a supply voltage that varies based on the input signal.

FIG. 1 further shows simplified block diagrams of a wireless device in accordance with embodiments of the current invention. A wireless device, such as UE 101 or base station 102, has an antenna 135, which transmits and receives radio signals. An RF transceiver module 133, coupled with the antenna, receives RF signals from antenna 135, converts them to baseband signals and sends them to processor 132. RF transceiver 133 also receives baseband signals from processor 132, converts them to RF signals, and sends out to antenna 135. Processor 132 processes the received baseband signals and invokes different functional modules to perform features in the wireless device. Memory 131 stores program instructions and data 134 to control the operations of the wireless device.

The wireless device also includes multiple function modules that carry out different tasks in accordance with embodiments of the current invention. A closed-loop ET module 141 performs closed-loop envelope tracking for the power amplifier. An adaptive process engine 142 adaptively update the AM/AM LUT and/or AM/PM LUT based on predefined or preconfigured conditions. A PA target response module 143 adjusts the PA target response based on detected and/or preconfigured conditions. An impedance calculator 144 detects and calculates impedance changes. One or more temperature sensors 145 detects temperature changes in modules such the RF module and/or the PA module. In addition, Adaptive process engine 142 includes multiple modules to carry out different tasks in accordance with embodiments of the current invention. A reference signal detector 151 obtains a reference signal, wherein the reference signal is a baseband digital signal of the transmitted wireless signal. A detection signal detector 152 obtains a detection signal through a coupler, wherein the detection signal is a partial feedback from down-sampled PA outputs. A power/gain difference calculator 153 computes a difference between a measured amplitude response and the PA target response based on the reference signal and the detection signal. A PA supply voltage LUT module 154 adjusts the PA supply voltage compensation LUT based on the computed power/gain difference. A DPD LUT module 155 adjusts an AM/PM phase compensation LUT and/or an AM/AM compensation LUT for DPD based on the computed response difference to maintain the linearity of the ET.

Envelope tracking enables the optimum performance point to be selected for any given level of RF power output by varying the voltage on the RF power amplifier. With the growing demand for higher data rates, linear amplifiers must be used to preserve the modulation content.

In one novel aspect of the current invention, the PA target response can be adjusted based on PA related system setting or detected environment settings. The adjusted PA gain is then used to update dynamically the LUT such that the system achieves the newly adjusted target response. The LUT is normally calibrated such that the resulted PA gain meets predefined PA performance/response. However, if PA characteristics change over the time, the actual gains for different input amplitudes may no longer meet the predefined gain criterion resulting in degradation in the system performance. For many modern wireless transmitters, maintaining the linearity is crucial for the overall system performance.

Figure 2:
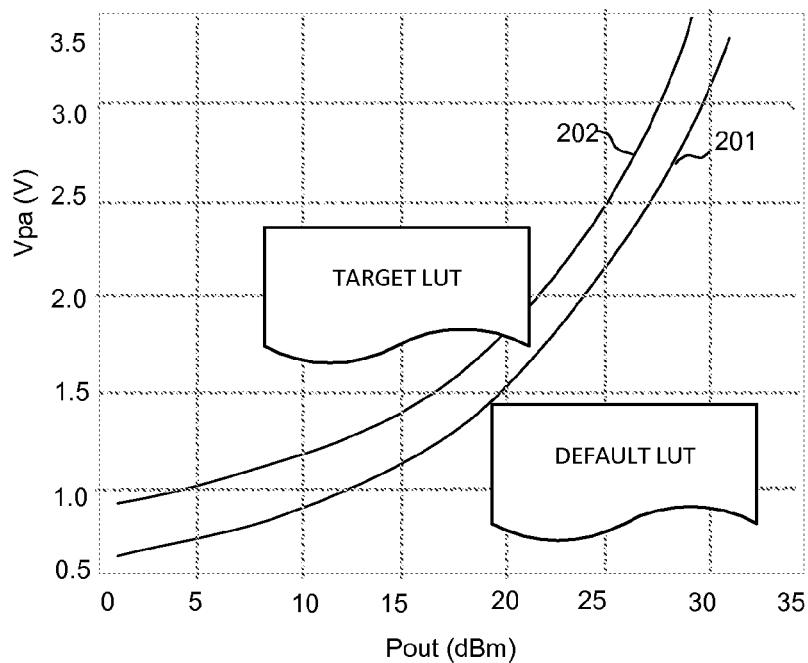
FIG. 2 shows exemplary diagrams of output power to supply voltage LUTs mapped in different target responses.

FIG. 2 shows exemplary diagrams of output power to supply voltage LUT mapped in different target responses. A curve 201 shows an exemplary amplitude LUT curve calibrated in a default setting. The calibrated LUT is designed to result in a PA gain that stays at the PA target response for any input. However, PA characteristics are known to be prone to change due to various factors, such as temperature changes. FIG. 2 also shows a curve 202, which is an exemplary amplitude LUT curve calibrated at a PA target response due to environmental changes. As shown, curve 202 shifts away from curve 201. If the ET system continues using the LUT calibrated default setting, the system cannot obtain the required linearity when operating in a changed environment. The LUT needs to be updated adaptively in response to changes that result in PA characteristics changes, such as the temperature changes.

Figure 3:
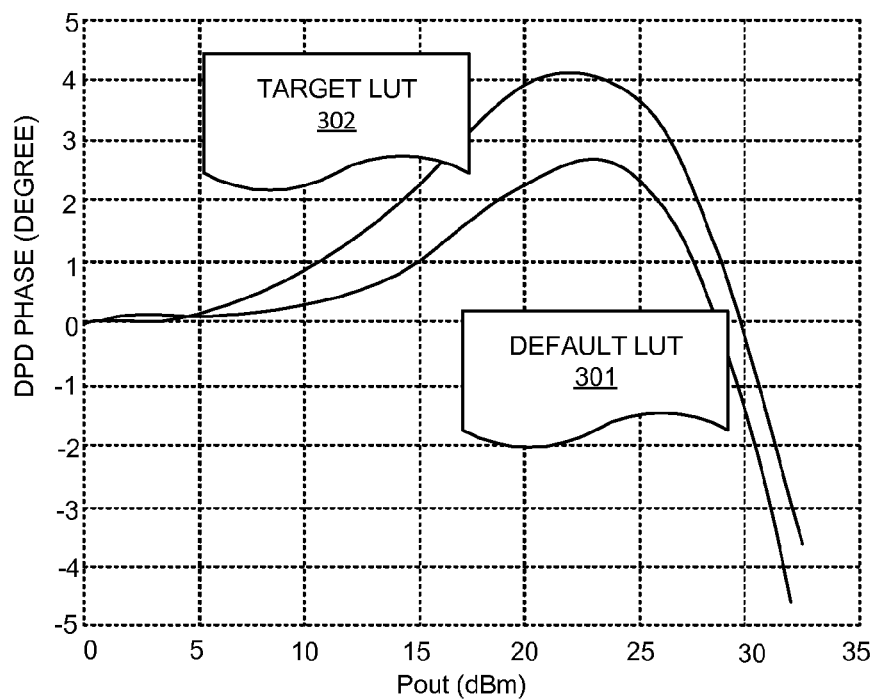
FIG. 3 shows exemplary diagrams of output power to phase LUTs mapped in different target responses.

FIG. 3 shows exemplary curves showing the relationship of output power to phase LUT mapped for different temperatures. A curve 301 shows an exemplary phase LUT curve calibrated in a default/original setting. The calibrated LUT is designed to result in a PA gain that stays at the PA target response for any input. However, PA characteristics are known to be prone to change due to various factors, such as temperature changes. FIG. 3 also shows a graph 302, which is an exemplary phase LUT curve calibrated in a changed environment. As shown, curve 302 shifts away from curve 301 under different environmental conditions. If the ET system continues using the phase LUT calibrated in the default setting, the system cannot obtain the required linearity when operating at the changed environment. The phase LUT needs to be updated adaptively in response to changes that result in changes in PA characteristics, such as temperature changes.

Figure 4:
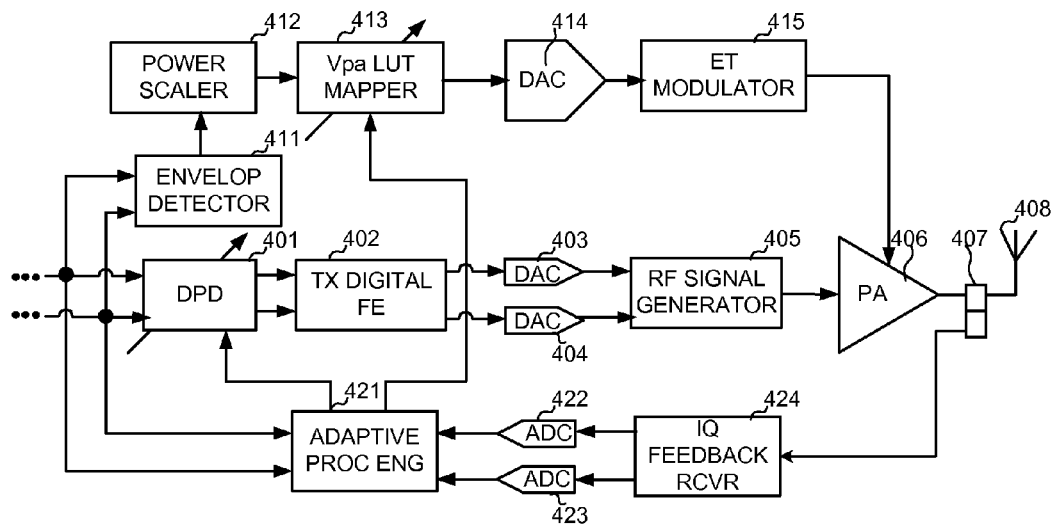
FIG. 4 shows an exemplary block diagram of a closed-loop ET system that adaptively adjusts its LUT on-the-fly using system modulation signals in accordance with embodiments of the current invention.

FIG. 4 shows an exemplary block diagram of a closed-loop ET system that adaptively adjust its LUT on-the-fly using system modulation signals in accordance with embodiments of the current invention. The closed-loop ET system includes a transmission path, an ET path, and a feedback path.

The transmission path transmits the amplified signal using a modulation signal defined by a wireless standard. A digital predistortion (DPD) module 401 receives baseband signals and passes the processed signal to transmitter digital frontend processor 402. DPD 401 receives baseband signals and performs AM/PM phase compensation and AM/AM compensation. AM/PM phase compensation controls AM/PM distortion. AM/AM compensation controls AM/AM distortion. The output of DPD 401 is sent to transmitter digital frontend processor (TxDFE) 402. TxDFE 402 sends the signal to digital-analog converters (DAC) 403 and 404, which convert the baseband digital signals to analog signals. The converted analog signal is sent to an RF module 405. The output of RF module 405 is the input signal for a PA 406. PA 406 amplifies the received input signals and sends the amplified output signal to a radio frontend module 407. Radio frontend module 407 drives the amplified output signal from PA 406 to an antenna 408, which transmits the RF signal according a wireless standard.

The ET path tracks modulation envelope and adjusts the supply voltage to PA 406 based on the detected envelope. An envelope detector 411 receives the same signal to DPD 401. Envelope detector 411 detects the envelope of the received signal and sends it to a power scaler 412. The scaler is not limited to power scaling; for example, a gain scaler could be utilized as well. Power scaler 412 sends the scaled signal to a Vpa LUT mapper 413. Vpa LUT mapper 413 maintains a Vpa mapping LUT to achieve the maximum linearity for the system. Upon receiving the input signal, the ET path applies an LUT to generate a supply power signal. Vpa LUT mapper 413 sends the generated supply power signal to a DAC 414. The output of DAC 414 is passed to an ET modulation module 415, which generates the supply voltage for PA 406 based on the detected envelope and the amplitude.

The feedback path takes output signals into an adaptive feedback process engine and compares with the input signal. In one novel aspect, the feedback path also sends other PA-related system information to the adaptive process engine. An IQ feedback receiver 424 takes the output RF signal and sends it to an analog to digital converters (ADC) 422 and 423. In one embodiment, IQ feedback receiver 424 takes the output RF signal before the radio FE. In another embodiment, IQ feedback receiver 424 takes the output RF signal after the radio FE. The digital signals from the outputs of ADC 422 and 423 are sent to an adaptive processing engine 421. In one novel aspect, adaptive process engine 421 takes inputs from two paths. In one path, adaptive process engine 421 receives the same input baseband signal as DPD 401, also referred as the reference signal. The output signal received from ADC 422 and 423, also referred as the detection signal, is fed to adaptive process engine 421 as well.

Ideally, the detection signal is the multiple of the reference signal with the target loop gain. Practically, variety of signal noises added to the path and the detection signal is not purely linear to the reference signal. Thereby, with the actual gain and phase error measured for the n-th LUT entry, adaptive processing engine 421 would update the corresponding supply voltage and phase LUT contents according to the measured gain difference or phase error, either step-wise or linearly.

Upon detecting and calculating new entries for the AM/AM LUT and AM/PM LUT, adaptive processing engine 421 updates the AM/AM LUT for Vpa LUT mapper 413 and the AM/PM LUT and the AM/AM LUT for DPD 401. The feedback path takes the output signal from the transmission path and compares the output signal with the input signal. Based on the comparison of the live traffic, adaptive processing engine 421 adaptively maintains the linearity of the ET system under operating condition of the PA using standardized modulation signal specified by the wireless standard by updating the PA supply voltage compensation LUT. By using the standardized modulation signal specified by the wireless standard that the wireless device is operating under, there is no training signal required. The calibration is done on-the-fly without any operation interruption. The on-the-fly calibration refers to performing the detection and compensation to the communication signal without hindering, interrupting or stopping the normal operation of the transceiver of the UE. The normal operation includes circuit initialization, data transmission, data reception, and every operation after power-on for the UE. In some implementations, the on-the-fly calibration involves determining the mismatch and updating the LUTs at a regular time interval when the transceiver is in operation. In other implementation, the on-the-fly calibration is carried out whenever a specific environment condition is met, e.g., the ambient temperature has changed, while the transceiver is performing any other normal operation. In any case, the on-the-fly process is carried out by a number of times after power-on, without any interruption to the normal process.

In another novel aspect, the PA target response is adjusted in response to PA-related changes, such as system configuration changes and changes in indicators measured from the transmitter. In one embodiment, the PA target response/ performance is adjusted by adjusting the PA supply voltage compensation LUT. FIGS. 5 to 8 show different embodiments in adjusting the PA target response/performance and updating the PA supply voltage LUT and/or phase LUT (also referred as AM/PM LUT) and/or gain LUT (also referred as AM/AM LUT) based on detected changes from the feedback channels.

Figure 5:
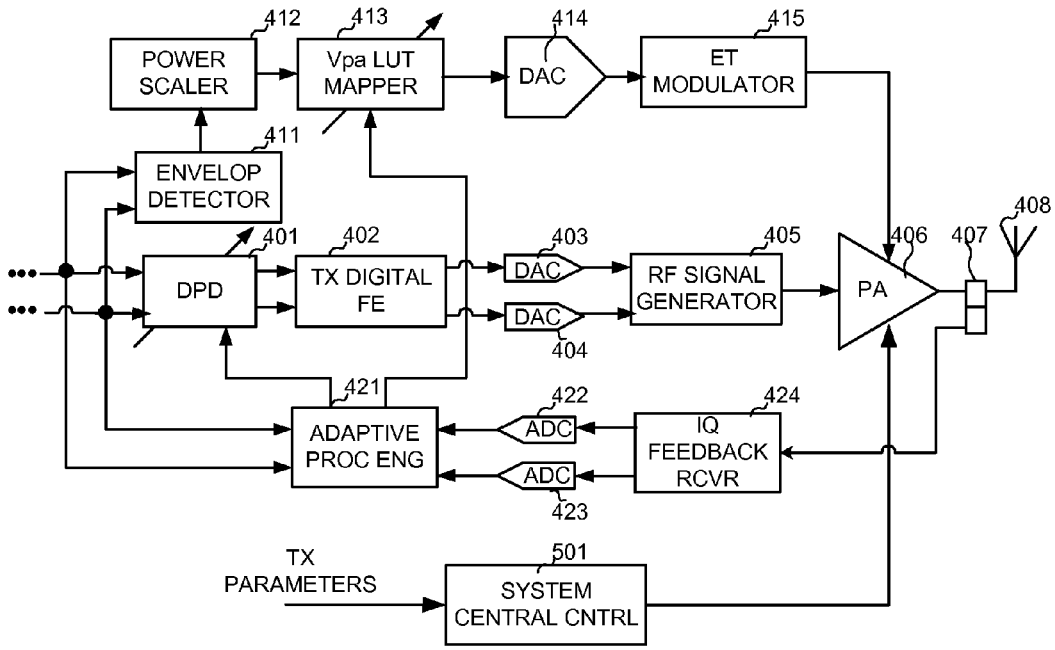
FIG. 5 shows an exemplary block diagram of a closed-loop ET system that adaptively adjusts its PA setting based on changes in system configuration information.

FIG. 5 shows an exemplary block diagram of a closed-loop ET system that adaptively adjusts its PA target response based on changes in system configuration information. Adaptive process engine 421, as also shown in FIG. 4, compares input signals and detection/output signals and adjusts the PA supply voltage LUT and/or phases LUT and/or gain LUT based on the comparison. The purpose of the adjustment is to retain the linearity for the PA by adjusting distortions. In adjusting the PA supply voltage LUT and/or phase LUT and/or gain LUT, adaptive process engine 421 would first assume target response for the PA. In one novel aspect, the target response/performance of the PA can be dynamically adjusted based on changes in transmission parameters. In one embodiment, a system central controller 501 communicates with adaptive process engine 421. System central controller 501 obtains system information, such as transmission parameter changes, such as output power target or resource allocation information. For example, when the output power target is low or when the allocated resource is small, the target PA amplitude may be adjusted to a lower level. In another example, upon configuring PA 406 to a new PA gate bias setting, system central controller 501 informs adaptive process engine 421 such that a new target response may be selected based on the new configuration. System central controller 501 communicates the obtained information to adaptive processing engine 421. Adaptive processing engine 421 determines if the PA target response needs to be adjusted based on information received from system central controller 501. In one embodiment, system central controller 501 determines that the PA target response needs to be adjusted. Subsequently, adaptive process engine 421 updates the PA supply voltage LUT and/or phase LUT and/or gain LUT based on the new PA target response. In another embodiment, system central controller 501 directly communicates with PA 406. In one embodiment, system central controller 501 determines whether to adjust the PA target response to a new value based on the transmission parameters scheduled by the base station. If so, system central controller 501 updates PA 406 with the new gain target.

Figure 6:
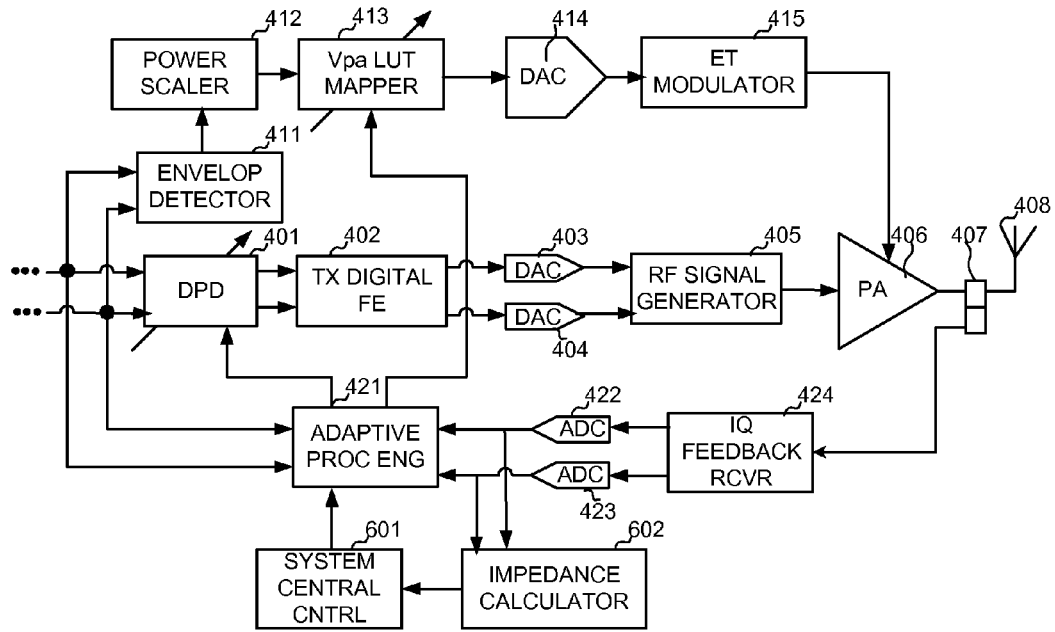
FIG. 6 shows an exemplary block diagram of a closed-loop ET system that adaptively adjusts its PA target response based on detected changes in PA impedance.

FIG. 6 shows an exemplary block diagram of a closed-loop ET system that adaptively adjusts its PA target response based on detected changes in PA impedance. In one embodiment, the assumed PA target response is modified based on changes in impedance. An impedance calculator 602 detects and calculates impedance from the output of ADC 422 and ADC 423. Impedance calculator 602 communicates with system central controller 601. System central controller 601 determines whether the change of impedance is bigger than a predefined threshold. If so, system central controller 601 determines a new PA target response for the PA and updates the PA supply voltage LUT and/or phase LUT and/or gain LUT accordingly. In another embodiment, system central controller 601 determines whether to use a new PA target response based on the calculated impedance received. If so, system central controller 790 updates the PA supply voltage LUT and/or phase LUT using the new PA target response accordingly.

Figure 7:
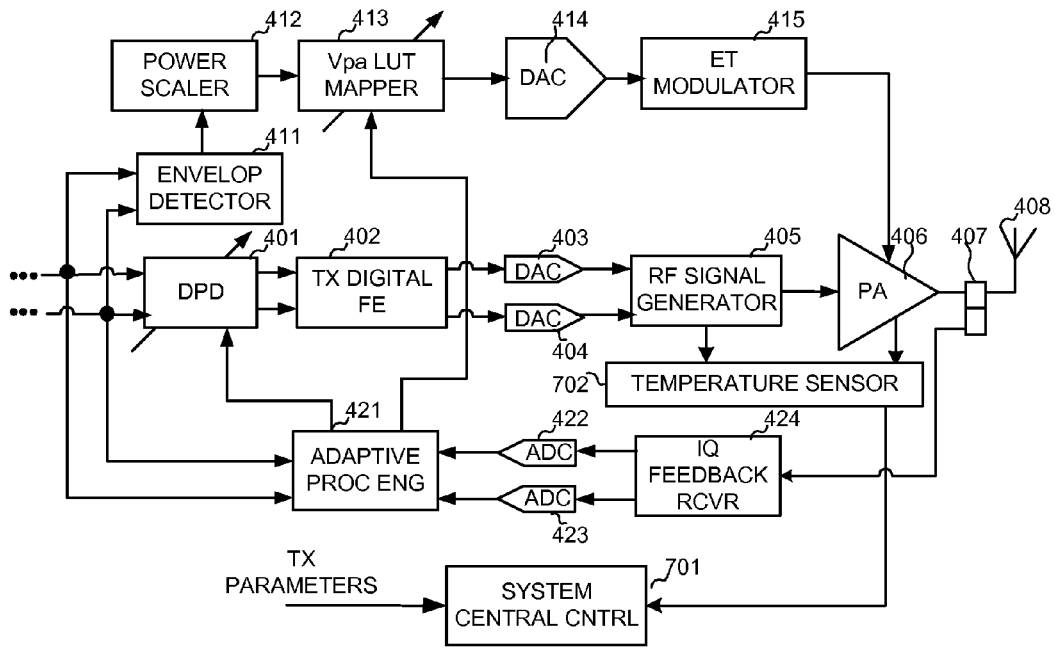
FIG. 7 shows an exemplary block diagram of a closed-loop ET system that adaptively adjusts its PA target response based on detected changes in RF and/or PA temperatures.

FIG. 7 shows an exemplary block diagram of a closed-loop ET system that adaptively adjusts its assumed PA target response based on detected changes in RF and/or PA temperatures. A temperature sensor 702 detects temperature changes for RF 405 and/or PA 406. System central controller 701 reads measured temperature from the temperature sensor and determines whether to modify the assumed PA target response based on the temperature information of PA 406 and/or RF 405. If so, system central controller 701 updates the PA supply voltage LUT and/or phase LUT and/or gain LUT based on the modified assumed PA target response accordingly.

Figure 8:
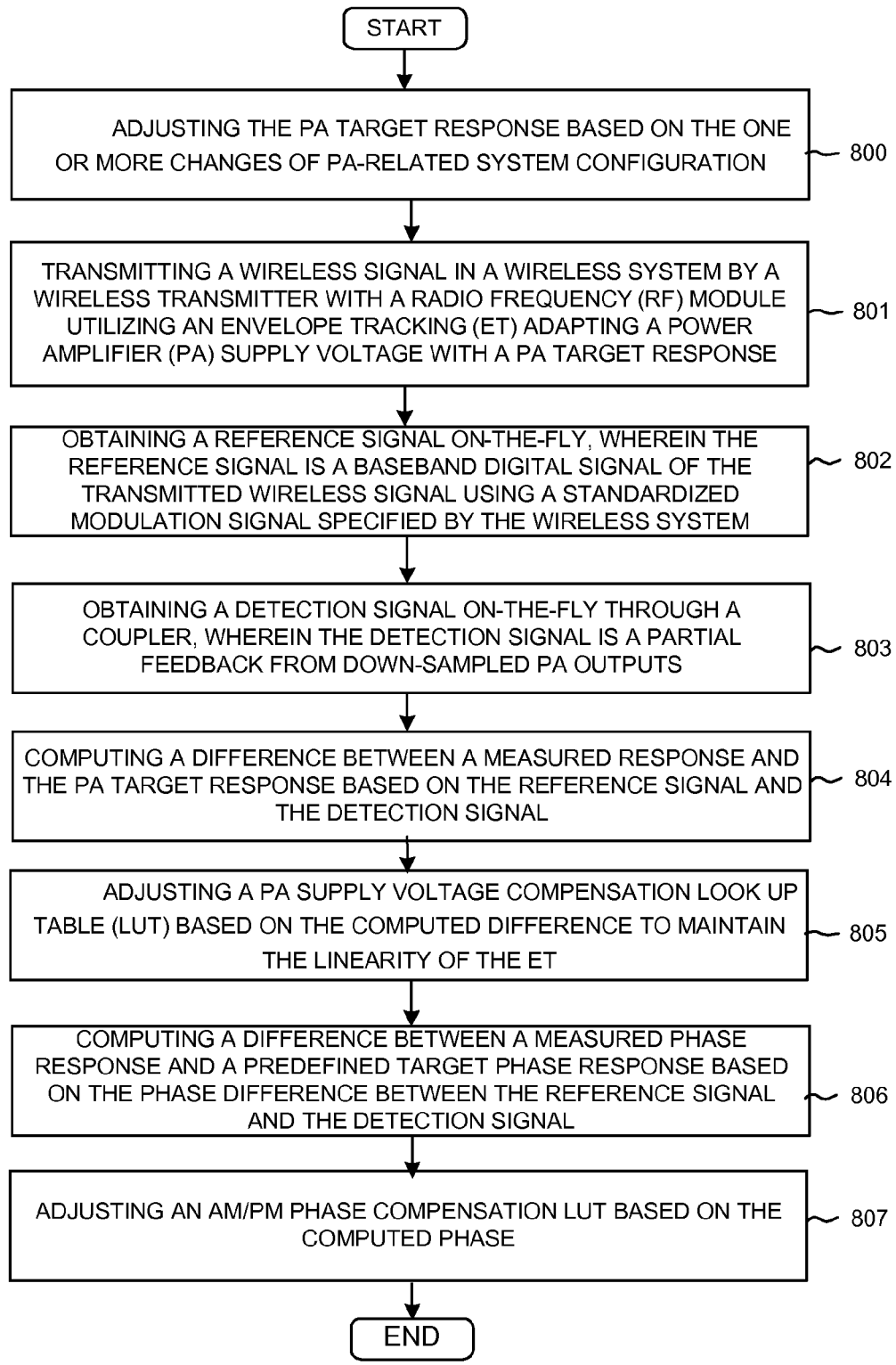
FIG. 8 is an exemplary flow chart for on-the-fly calibration for a closed-loop envelope tracking system of a power amplifier for a wireless transmitter in accordance with embodiments of the current invention.

FIG. 8 is an exemplary flow chart for an on-the-fly calibration for a closed-loop envelope tracking system of a power amplifier for a wireless transmitter in accordance with embodiments of the current invention. At step 800, the wireless transmitter adjusts the PA target response based on the one or more changes of PA-related system configuration or the one or more transmitter indicators. At step 801, the wireless transmitter transmits a wireless signal in a wireless system by a wireless transmitter with a radio frequency (RF) module utilizing an envelope tracking (ET) adapting a power amplifier (PA) supply voltage with a PA target response. At step 802, the wireless transmitter obtains a reference signal on-the-fly, wherein the reference signal is a baseband digital signal of the transmitted wireless signal using a standardized modulation signal specified by the wireless system. At step 803, the wireless transmitter obtains a detection signal on-the-fly through a coupler, wherein the detection signal is a partial feedback from down-sampled PA outputs. At step 804, the wireless transmitter computes a difference between a measured response and the PA target response based on the reference signal and the detection signal. At step 805, the wireless transmitter adjusts a PA supply voltage compensation look up table (LUT) based on the computed difference to maintain the linearity of the ET. At step 806, the wireless transmitter computes a difference between a measured phase and a predefined target phase based on the phase difference between the reference signal and the detection signal. At step 807, the wireless transmitter adjusts an AM/PM phase compensation LUT based on the computed phase difference to maintain the linearity of the ET.

Although the present invention has been described in connection with certain specific embodiments for instructional purposes, the present invention is not limited thereto. Accordingly, various modifications, adaptations, and combinations of various features of the described embodiments can be practiced without departing from the scope of the invention as set forth in the claims.

What is claimed is:
1. A method comprising:
 transmitting a wireless signal in a wireless system by a wireless transmitter with a radio frequency (RF) module utilizing an envelope tracking (ET) calibration by adjusting a power amplifier (PA) supply voltage based on a PA target response;
 obtaining a reference signal on-the-fly, wherein the reference signal is a baseband signal of the transmitted wireless signal;
 performing digital predistortion on the reference signal;
 obtaining a detection signal on-the-fly through a coupler, wherein the detection signal is a partial feedback from PA outputs;
 determining based on changes in transmission parameters resulting from the digital predistortion performed on the reference signal that the PA target response needs to be adjusted;

computing a difference between a measured response and the PA target response based on the reference signal and the detection signal;

adjusting the PA target response based on the computed difference to maintain the linearity of the ET calibration; and updating an AM/PM phase compensation look up table (LUT) based on the adjusted PA target response.

2. The method of claim 1, further comprising:

computing a difference between a measured phase response and a predefined target phase response based on the phase difference between the reference signal upon which digital predistortion has been performed and the detection signal; and adjusting the AM/PM phase compensation LUT based on the computed phase.

3. The method of claim 1, further comprising:

computing a difference between a measured amplitude response and a target amplitude response; and adjusting an AM/AM compensation LUT for a digital predistortion process based on the computed amplitude difference.

4. The method of claim 1, further comprising:

monitoring one or more PA-related system configuration changes; and adjusting the PA target response based on the one or more changes of PA-related system configuration.

5. The method of claim 4, further comprising:

updating the PA supply voltage compensation LUT based on the adjusted PA target response.

6. The method of claim 4, wherein the digital predistortion performed on the reference signal is an AM/PM predistortion.

7. The method of claim 4, further comprising:

updating an AM/AM compensation LUT for a digital predistortion process based on the adjusted PA target response.

8. The method of claim 1, further comprising:

monitoring one or more transmitter indicators measured from the transmitter; and adjusting the PA target response based on the one or more transmitter indicators.

9. The method of claim 8, further comprising:

updating the PA supply voltage compensation LUT based on the adjusted PA target response.

10. The method of claim 8, further comprising:

updating an AM/PM phase compensation LUT based on the adjusted PA target response.

11. The method of claim 8, further comprising:

updating an AM/AM gain compensation LUT for a digital predistortion process based on the adjusted PA target response.

12. The method of claim 8, wherein the transmitter indicator is PA impedance.

13. The method of claim 8, wherein transmitter indicators are temperature measures of the PA or the RF module.

14. An apparatus, comprising:

a wireless radio frequency (RF) module that transmits a wireless signal specified in a wireless standard;

a closed-loop envelope tracking (ET) system with a PA target response for a supply voltage of a power amplifier (PA) for the wireless RF module;

an adaptive processing engine that adaptively maintains a linearity of the ET system under operating conditions of the PA using a modulation signal specified by the wireless standard, wherein the adaptive processing engine includes a digital predistortion module that predistorts a baseband signal of the transmitted wireless signal to generate a reference signal; and a system central controller that determines based on changes in transmission parameters resulting from the predistortion performed to generate the reference signal that the PA target response needs to be adjusted, wherein the adaptive processing engine updates an amplitude-modulation (AM)/phase-modulation (PM) phase compensation LUT using a difference between a measured response and the PA target response based on the reference signal and a detection signal that is a partial feedback from down-sampled PA outputs.

15. The apparatus of claim 14, wherein the adaptive processing engine comprises:

a reference signal detector that obtains the reference signal;

a detection signal detector that obtains the detection signal through a coupler;

a difference calculator that computes the difference between the measured response and the PA target response based on the reference signal and the detection signal; and a PA supply voltage LUT module that adjusts a PA supply voltage compensation LUT based on the computed difference.

16. The apparatus of claim 15, wherein the adaptive processing engine further comprises:

a phase calculator that computes a difference between a measured phase and a predefined target phase based on the phase difference between the reference signal and the detection signal; and a phase LUT module that adjusts the AM/PM phase compensation LUT based on the computed phase difference to maintain the linearity of the ET system.

17. The apparatus of claim 15, further comprising:

a PA target response module that adjusts the PA target response for the ET system.

18. The apparatus of claim 17, wherein the adjusting the PA target response involves:

monitoring one or more PA-related system configuration changes; and adjusting the PA target response based on the one or more changes of PA-related system configuration.

19. The apparatus of claim 18, wherein the adjusting the PA target response further involves:

updating the PA supply voltage compensation LUT based on the adjusted PA target response.

20. The apparatus of claim 18, wherein the adjusting the PA target response further involves:

updating the AM/PM phase compensation LUT based on the adjusted PA target response.

21. The apparatus of claim 18, wherein the adjusting the PA target response further involves:

updating an AM/AM compensation LUT for a digital predistortion process based on the adjusted PA target response.

22. The apparatus of claim 17, wherein the adjusting the PA target response involves:

monitoring one or more transmitter indicators measured from the transmitter; and adjusting the PA target response based on the one or more transmitter indicators.

23. The apparatus of claim 22, wherein the adjusting the PA target response further involves:

updating the PA supply voltage compensation LUT based on the adjusted PA target response.

24. The apparatus of claim 22, wherein the digital predistortion module generates the reference signal by predistorting the baseband digital signal using AM/PM predistortion.

25. The apparatus of claim 22, wherein the adjusting the PA target response further involves:
updating an AM/AM compensation LUT for a digital predistortion process based on the adjusted PA target response.

26. The apparatus of claim 22, wherein the transmitter indicator is PA impedance.

27. The apparatus of claim 22, wherein transmitter indicators are temperature measures of the PA or the RF module.

* * * * *